US012416687B2

(12) United States Patent
Sadeghnia et al.

(10) Patent No.: US 12,416,687 B2
(45) Date of Patent: Sep. 16, 2025

(54) METHOD AND DEVICE FOR ANALYSING THE STATE, CONDITION AND POWER QUALITY OF TRANSFORMERS IN POWER GRIDS

(71) Applicant: OKTO Grid ApS, Copenhagen (DK)

(72) Inventors: Golam Reza Wöhlk Sadeghnia, Frederiksberg (DK); Paul Henri Marcel Didier, Leuven (BE); Rasmus Per Johansson, Copenhagen (DK); Anders Filtenborg, Frederiksberg (DK)

(73) Assignee: OKTO Grid ApS, Copenhagen (DK)

( * ) Notice: Subject to any disclaimer, the term of this patent is extended or adjusted under 35 U.S.C. 154(b) by 0 days.

(21) Appl. No.: 18/023,625

(22) PCT Filed: Aug. 30, 2021

(86) PCT No.: PCT/DK2021/050265
§ 371 (c)(1),
(2) Date: Feb. 27, 2023

(87) PCT Pub. No.: WO2022/042812
PCT Pub. Date: Mar. 3, 2022

(65) Prior Publication Data
US 2024/0103098 A1    Mar. 28, 2024

(30) Foreign Application Priority Data
Aug. 31, 2020    (DK) .......................... PA 2020 70562

(51) Int. Cl.
*G01R 29/20* (2006.01)
*G01H 1/16* (2006.01)
(Continued)

(52) U.S. Cl.
CPC .............. *G01R 31/62* (2020.01); *G01H 1/16* (2013.01); *G06F 17/142* (2013.01)

(58) Field of Classification Search
CPC . G01R 31/62; G01H 1/00; G01H 1/03; G01H 1/04; G01H 1/06; G01H 1/08;
(Continued)

(56) References Cited

U.S. PATENT DOCUMENTS

| 4,095,173 A * | 6/1978 | Darrel ................ G01R 31/1209 324/535 |
| 8,849,587 B1 | 9/2014 | Lightle et al. |

(Continued)

FOREIGN PATENT DOCUMENTS

| EP | 1786083 A1 | 5/2007 |
| WO | WO2020160590 A1 | 8/2020 |

OTHER PUBLICATIONS

Adnan Secic et al., "Vibro-Acoustic Methods in the Condition Assessment of Power Transformers: A Survey", IEEE Access, vol. 7, Jan. 1, 2019, pp. 83915-83931, XPO55733464, DOI: 10.1109/ACCESS.2019.2923809—the whole document.
(Continued)

*Primary Examiner* — Thang X Le
(74) *Attorney, Agent, or Firm* — Holland & Hart LLP

(57) ABSTRACT

Methods, apparatuses, and systems for analysing the state of power transformers are described. A method may include providing at least one sensor arranged relative to a power transformer, retrieving at least one vibroacoustic signal from said at least one sensor, performing a time-frequency decomposition of said at least one vibroacoustic signal from a time domain to a frequency domain, identifying one or more vibroacoustic harmonic frequencies provided by the fast Fourier transformation of the at least one vibroacoustic signal, calculating an amplitude value and a phase angle related to the one or more harmonic frequencies, retrieving an electromagnetic signal emitted from the power transformer, a temperature generated by the power transformer, or both, and providing at least one analysed information
(Continued)

from the amplitude value and the phase angle related to the one or more harmonic frequencies, the electromagnetic signal, the temperature, or any combination thereof.

14 Claims, 7 Drawing Sheets

(51) Int. Cl.
*G01R 31/62* (2020.01)
*G06F 17/14* (2006.01)

(58) Field of Classification Search
CPC .......... G01H 1/14; G01H 1/16; G01N 29/032; G01N 29/36
See application file for complete search history.

(56) References Cited

U.S. PATENT DOCUMENTS

| | | | |
|---|---|---|---|
| 9,766,285 B2 | 9/2017 | Scocchetti | |
| 10,841,694 B2 * | 11/2020 | Miller | G01R 31/00 |
| 11,899,053 B2 * | 2/2024 | Najafi | G01R 31/1272 |
| 2009/0230980 A1 * | 9/2009 | Williams | G01R 27/32 |
| | | | 324/707 |
| 2011/0031980 A1 | 2/2011 | Borsi et al. | |
| 2015/0091598 A1 * | 4/2015 | Han | G01R 31/1227 |
| | | | 324/754.21 |
| 2018/0128673 A1 * | 5/2018 | Oshetski | G01R 31/62 |
| 2022/0128539 A1 * | 4/2022 | Harris | H04Q 9/00 |
| 2023/0024104 A1 * | 1/2023 | Ding | G01R 31/62 |

OTHER PUBLICATIONS

B. Garcia, et al., "Vibro-Acoustic Methods in the Condition Assessment of Power Transformers: A Survey"., IEEE Transactions on Power Delivery, vol. 21, No. 1, Dec. 27, 2005 (Dec. 27, 2005), pp. 167-169, XP055546052, US ISSN: 0885-8977, DOI 10.1109/TPWRD.2005.852275—the whole document.

* cited by examiner ated under 35 U.S.C. 371 of International Patent Application No. PCT/DK2021/050265 by Sadeghnia et al., entitled "METHOD AND DEVICE FOR ANALYSING THE STATE, CONDITION AND POWER QUALITY OF TRANSFORMERS IN POWER GRIDS", filed Aug. 30, 2021, and claims the benefit of Danish Patent Application No. PA 2020 70562 by Sadeghnia et al., entitled "METHOD AND DEVICE FOR ANALYSING THE STATE, CONDITION AND POWER QUALITY OF TRANSFORMERS IN POWER GRIDS", filed Aug. 31, 2020, each of which is assigned to the assignee hereof and is incorporated by reference in its entirety.

METHOD AND DEVICE FOR ANALYSING THE STATE, CONDITION AND POWER QUALITY OF TRANSFORMERS IN POWER GRIDS

CROSS-REFERENCE

The present application is the national phase entry under 35 U.S.C. 371 of International Patent Application No. PCT/DK2021/050265 by Sadeghnia et al., entitled "METHOD AND DEVICE FOR ANALYSING THE STATE, CONDITION AND POWER QUALITY OF TRANSFORMERS IN POWER GRIDS", filed Aug. 30, 2021, and claims the benefit of Danish Patent Application No. PA 2020 70562 by Sadeghnia et al., entitled "METHOD AND DEVICE FOR ANALYSING THE STATE, CONDITION AND POWER QUALITY OF TRANSFORMERS IN POWER GRIDS", filed Aug. 31, 2020, each of which is assigned to the assignee hereof and is incorporated by reference in its entirety.

TECHNICAL FIELD

The present disclosure relates to the state and condition of power transformers connected to power grids.

BACKGROUND

Power transformers related to the electrical power grids are widely used. The electricity grid has become more complex with fluctuating production from variable renewable energy, decentralised energy storage and flexible consumption. With the added complexity and introduction of power conversion using inverters and converters, there is further an introduction of power system harmonics. Power transformers are critical equipment in every stage of electricity transmission from a power plant to the residential houses, and therefore the operational reliability of the power transformers is very crucial.

While power transformers are significant to electric power grids, transformer failures are common and costly. There are many causes of failure: insulation failures, design and/or manufacturing errors, oil contamination, overloading, line surge, loose connections, moisture, and other man-made or natural causes.

Power transformers are often used in electric power grids. For example, the three-phase power transformers are usually more economical than equivalent single-phase transformers, because the tree-phases power transformers use less conductor material to transmit a given amount of electrical power which is needed in large power installations.

In a symmetric three-phase power supply system, three conductors each carry an alternating current of the same frequency and voltage amplitude relative to a common reference but with a phase difference of one third of a cycle between each. The common reference is usually connected to ground and often to a current-carrying conductor called the neutral. It is also possible to design and implement asymmetric three-phase power systems with unequal voltages or phase shifts.

Power transformers are particularly vulnerable to higher harmonics—especially, for infrastructure that has not been designed for today's complex electricity waveforms. In particular, harmonic loads cause higher temperature increases at the windings of the transformer, which in turn deteriorates these windings lowering the expected life-span of the transformer. It is not easy to know when transformers are overloaded and which failures may occur eventually.

The document U.S. Pat. No. 8,849,587 B1 discloses A method for determining the health of a transformer through vibration measurement. A vibratory signal, in the form of a physical mechanical vibration or auditory signal, is received at a sensor. The vibratory signal is converted into a frequency representation of the signal to derive its harmonics. Based on the power level for the harmonics in the vibratory signal, the harmonic current ratios in the transformer are calculated. The harmonic current ratios are summed together to quantify the health of the transformer. This value is called a K-factor and is a quantification of the health of the transformer. However, the K-factor does not provide information regarding the type of error, which compromises or may in time compromise the health of the transformer.

Furthermore the monitoring and/or reliability systems, which is used today, does not take into consideration the noise from the environment and the influences on the power transformers or the measurement of the power transformer, such as ambient signals and/or noise etc. This may easily lead to false results, and the system may overlook important failures, which may be crucial for the power transformers and the surroundings.

SUMMARY

It is an object of the disclosure to provide a method and a data processing system for analysing the state of power transformers and power quality in grids. It is an object of the method and the data processing system to provide a solution for monitoring overload in power transformers and ensure a correct and reliable measurement of the power transformers, when determining the working state and condition of the power transformers.

It is an object of the disclosure to provide a method that reduces maintenance costs and expand the life-span of the power transformer, by monitoring the power transformers in real time, and predicting failures before the failures become destructive for the power transformer. It is an object of the data processing system to be easy to implement in existing and new power transformers.

The present disclosure addresses this by providing a computer implemented method of analysing the state of power transformers in power grids, where the method is capable of detecting unwanted loads which is related to the power transformer and/or indicates and/or predicts which error may occur in the power transformer, wherein the method comprises the acts of:
  a) providing at least one sensor arranged relative to said power transformer,
  b) retrieving at least one vibroacoustic signal from said at least one sensor,
  c) performing a time-frequency decomposition of said at least one vibroacoustic signal from a time domain to a frequency domain using fast Fourier transformation,
  d) identifying one or more vibroacoustic harmonic frequencies provided by the fast Fourier transformation of the said at least one vibroacoustic signal,
  e) calculating an amplitude value and a phase angle related to said one or more harmonic frequencies,
  f) retrieving an electromagnetic signal emitted from said power transformer using at least one EMF sensor, and/or retrieving temperature generated by the power transformer using at least one temperature sensor measuring, g) providing at least one analysed information from the said amplitude value and said phase angle related to said one or more harmonic frequencies and said electromagnetic signal and/or temperature, where the analysed information is related to the state of the power transformer.

The power transformers may emit an audible humming or buzzing sound. Often, these sounds are regarded as unwanted noise, which can be rather loud and annoying. However, the sounds/vibrations can offer insight into irregularities in the transformer condition and be used for intuitively judging whether the transformer should be checked for maintenance needs.

The primary method for evaluating an overload of any of a transformer is to measure the winding or oil temperature, in case of oil-immersed transformers. Most existing transformers do not have temperature measurements, and retrofitting these is cumbersome and very expensive to perform. Additionally, a temperature rise is a secondary effect and may occur from a variety of different types of failures and power qualities.

Power transformers reflect the quality of the power that goes through them. Being able to retrofit transformers as measurement points of harmonic load may be used for establishing a grid-wide view of power quality and harmonic distribution, inherently allowing for subsequent analysis of power lines and strains on other equipment across the transmission and distribution power grids.

By knowing when transformers are overloaded, maintenance can be planned accordingly to take mitigating actions for reducing loss of operating hours. Especially the harmonic currents, which are present in a power distribution network, can present significant problems. For example power losses, overheating, resonances and over voltages, operational instability, and radio frequency disturbances. Any electronic circuit which presents a non-linear load may inherently generate harmonic currents. These kinds of error indications are very useful in planning maintenance. The transformers may be measured continuously to follow the performance of the transformer. Alternatively, the transformers may be measured periodically. The errors can then be detected very early, before becoming a problem.

Since the power transformers are the key components in electric power grids in terms of both reliability and investment, the reliability of transformers is a primary concern to grid operators. The reliability models of the power transformers are very important for the electric grid design, assessment, and operation.

The present disclosure provides a method that reduces maintenance costs and expands the lifespan of the power transformer. The health of the power transformers may be monitored in real time, and the failures may advantageously be predicted before the failures become destructive for the power transformer or other equipment.

The method detects the effect of unwanted loads coming from the grid, which is related to the power transformer. Sensors may be arranged relative to said power transformer, for example on the outer side of the cabinet or the inner side of the cabinet. The sensors may be microphones, capable of retrieving sound waves. The sensors may be vibration sensors, capable of retrieving vibrations. Both microphones and/or vibration sensors are capable of retrieving a signal, which in this description will be described as a vibroacoustic signal. Other types of sensors capable of retrieving signals from the power transformers may also be chosen, such as sensors measuring the electromagnetic field of the power transformer. The method is capable of retrieving at least one vibroacoustic signal from at least one sensor. Temperature measurement may also be chosen as an indication of the state of the power transformer. The temperature sensors may retrieve the temperature outside the power transformer.

The vibroacoustic signal received from the sensors is in a time domain. A time-frequency decomposition of said at least one vibroacoustic signal from a time domain to a frequency domain may be performed using fast Fourier transformation, FFT, wherein the frequency domain, the vibroacoustic harmonic frequencies are provided and easily identified.

When calculating an amplitude value and a phase angle related to said one or more harmonic frequencies, the method is capable of calculating input current harmonic composition of the power transformer from said amplitude value and said phase angle of said one or more vibroacoustic harmonic frequencies.

When the amplitude value and the phase angle, such as amplitude value and the phase angle of the current, related to the harmonic frequencies is calculated, the input DC offset is then calculated based on the result of the calculation related to the harmonic frequencies. When analysing said amplitude value and said phase angle relative to the input DC offset, the state of the power transformer can be determined.

The electromagnetic signal emitted from said power transformer may be retrieved using at least one EMF sensor. The electromagnetic signal is converted into an electromagnetic data, which can be used to specify and/or predict error which may occur in the power transformer. The electromagnetic data may be compared to the amplitude value and said phase angle related to the harmonic frequencies to specify and/or predict error which may occur in the power transformer.

The temperature generated by the power transformer may be retrieved using at least one temperature sensor measuring. The temperature may be converted into temperature data, which can be used to specify and/or predict error which may occur in the power transformer. The temperature data may be compared to the amplitude value and said phase angle related to the harmonic frequencies to indicate and/or predict which error may occur in the power transformer. The temperature data may be compared to the amplitude value and said phase angle related to the harmonic frequencies and/or the electromagnetic data to indicate and/or predict which error may occur in the power transformer.

The analysed information may comprise processed data related to amplitude value and the phase angle related to said one or more harmonic frequencies. The analysed information may also comprise processed data related to electromagnetic data and/or temperature data. The analysed information indicates and/or predicts which error may occur in the power transformer.

The system may perform a calibration, when initialising the installation, such that the system is ready for use. The system may even be configured to self-calibrate sensors and values used in the system etc. The automatic calibration may be calibrated to a specific power transformer. The calibrating process may be required if the ambient temperature and/or the temperature related to the power supply has changed by a specified amount. The process may be performed totally automated or may require user intervention and/or use of external calibrated artifacts. The purpose of the calibration is to provide and accuracy enhancement by characterization of errors inherent in the system. Self-calibration may also be referred to as normalization or standardization. The system may furthermore also perform periodic calibration if needed.

The calibrating process may be required at intervals, such as every power-on sequence; or once per shift, day, or week of continuous operation.

In an advantageous method of the disclosure, the method performs at least one noise reduction of said at least one vibroacoustic signal before performing said fast Fourier transformation.

A lot of different aspects are taken into consideration including further acts of measuring the vibroacoustic signal or signals on a power transformer operating in situ. Noise for the surroundings may cause errors in the measurement results, and lead to a wrong conclusion regarding the health of the power transformer. It is important to consider the surrounding sounds and reduce the surrounding sounds to a minimum. This may be done by using a noise reduction method, while the vibroacoustic signal or signals is in the time domain. A noise reduction may also be performed just after the FFT, before calculating the amplitude values and phase angles of the vibroacoustic harmonic frequencies. This will improve the reliability of the result calculated, and the state of the health of the power transformer is more accurate.

Under a purely linear load, the current and voltage both are sinusoidal with a frequency corresponding to the fundamental frequency of the electrical grid, e.g. 50 Hz or 60 Hz. However, in the typical context, the load is non-linear. In this case the current signal becomes more complex. In addition to the fundamental sine, other sinusoids of lesser amplitude and of frequencies integer multiples of the fundamental contribute to the current. Such frequency content is typically described as that of a "distorted sine", with a fundamental frequency and higher harmonics, such as 2nd, 3rd, etc. especially odd multiples of the $3^{rd}$ harmonic frequency is important to take into consideration when analysing the health of the power transformer.

In a further advantageous method of the disclosure, wherein the method comprises further acts of calculating a phase imbalance information related to the said one or more vibroacoustic harmonic frequencies, wherein the phase imbalance information comprises information regarding the state of phases in the power transformer.

When calculating an amplitude value and a phase angle related to said one or more harmonic frequencies, the method is capable of calculating an phase imbalance in case of multiple-phased transformer from said amplitude value and said phase angle of said one or more vibroacoustic harmonic frequencies.

When the power transformer is operating, it is important that the phase or phases generated in the power transformer and/or in the grids are balanced correctly. If the phase or phases are imbalanced, the power distributed in the grids may cause unwanted overload. The power transformers interact on each other, and cause damage to other power transformers and/or to the cables in the grids.

A problem may occur in the cables when the phase or phases are imbalanced. For example, standing waves are waves of voltage and current which do not propagate, but is the result of interference between incident and reflected waves along a cable line. If the phase or phases are in balance, the cables are designed according to the grid system. As an example, if the phase or phases are in imbalance, the cables and/or the grid system may be in risk of getting damaged due to the unwanted standing wave pattern in the cables.

In a still further advantageous method of the disclosure, wherein the method comprises further acts of:

calculating one or more load harmonic frequencies from said one or more vibroacoustic harmonic frequencies,
analysing said amplitude value and said phase angle related to said one or more load harmonic frequencies, and
providing a thermal model based on the one or more load harmonic frequencies, wherein the thermal model is capable of providing temperature information related to the state of the top-oil temperature and/or the hotspot temperature in the power transformer.

The thermal model is a computation or a formula formed as a result of an algorithm that takes some values as input and produces some value as output. The thermal model may be one or more trained model or models based on the input from vibroacoustic signal retrieved by the sensors.

Load harmonic frequencies are odd harmonic frequencies, such as $3^{rd}$, $5^{th}$ $7^{th}$ harmonics etc., retrieved from a non-linear load. The total harmonic distortion, THD, is measured from the odd harmonic distortion present in the vibroacoustic signal, and is defined as the ratio of the sum of the powers of all odd harmonic components to the power of the fundamental frequency.

When calculating one or more load harmonic frequencies from the vibroacoustic harmonic frequencies, the amplitude value and the phase angle related to the load harmonic frequencies may be calculated and provide a THD of load information. A thermal model may be provided based on the THD of load information, wherein the thermal model is capable of providing temperature information related to the state of the top-oil temperature and/or the hotspot temperature in the power transformer. The analysed information may also comprise the thermal model, temperature information, the state of the top-oil temperature and/or the hotspot temperature in the power transformer.

In a still further advantageous method of the disclosure, wherein the method comprises further acts of:

calculating one or more load harmonic frequencies from said one or more vibroacoustic harmonic frequencies,
analysing said amplitude value and said phase angle related to said one or more load harmonic frequencies and providing a THD of load information,
providing a magnetic model based on the THD of load information, wherein the magnetic model is capable of providing core saturation information related to the state of the core saturation in the power transformer.

When calculating an amplitude value and a phase angle related to said one or more harmonic frequencies, the method is capable calculating input total current harmonic distortion of the power transformer from said amplitude value and said phase angle of said one or more vibroacoustic harmonic frequencies.

When calculating one or more load harmonic frequencies from the vibroacoustic harmonic frequencies, the amplitude value and the phase angle related to the load harmonic frequencies may be calculated and provide a THD of load information. A magnetic model based may also be provided based on the THD of load information.

The magnetic model is a computation or a formula formed as a result of an algorithm that takes some values as input and produces some value as output. The magnetic model may be one or more trained model or models based on the input from vibroacoustic signal retrieved by the sensors.

The magnetic model is capable of providing core saturation information related to the state of the core saturation in the power transformer. The analysed information may also comprise the THD of load information, the magnetic model and/or the as a core saturation indicator.

The system may measure the electromagnetic field generated by the power transformer. The electromagnetic field measured may be an indication on how much the transformer is loaded. A higher current which is generated in the power transformer will generate a more powerful electromagnetic field. The measured electromagnetic field may provide a variable value. An overload or a variation of mechanical properties can be estimated from one or more of following: the value of the electromagnetic field, the estimated frequency signature of the vibrations etc.

A computer implemented method, wherein the power transformer is a three-phase power transformer.

Power transformers may be provided in power grids as one-phase or three-phase power transformers. For example, three phase system is provided with three phases, i.e., the current will pass through the three wires, and there will be one neutral wire for passing the fault current to the earth is known as the three-phase system. In other words, the system which uses three wires for generation, transmission and distribution is known as the three-phase system. The three-phase system is also used as a single phase system if one of their phase and the neutral wire is taken out from it. The sum of the line currents in the three-phase system is equal to zero, and their phases are differentiated at an angle of 120°.

The three-phase system has several advantages, for example the three-phase system requires fewer conductors as compared to the single-phase system. It also gives the continuous supply to the load. The three-phase system has higher efficiency and minimum losses.

When determining the method it is important to determine whether the power transformer is a one-phase or three-phase system. Calculating the health of the power transformer or even the power grids depend on using the correct predefined algorithm for either a one-phase or a three-phase. This may be achieved by automatic analysing the vibroacoustic signal or vibroacoustic harmonic frequencies. Alternatively, the setting may also be provided in the initialising installation.

The present disclosure also provides a data processing system. The data processing system comprises means for carrying out one or more acts for analysing the state of a power transformer in power grids, where the data processing system comprises:
- at least one sensor arranged relative to said power transformer, wherein said at least one sensor is capable for retrieving the acoustic-vibrations generated by the transformer,
- a processing unit configured to process the signals retrieved by said at least one sensor, and provide at least one analysed information, where the analysed information is related to the state of the power transformer, and
- a computer-readable storage medium for storing the analysed information.

The data processing system may comprise microphones and/or a vibrating sensor, where at least one of the sensors are arranged directly on the cabinet of the power transformer. The processing unit may be provided in a controlling device. A user interface may be provided so one or more users, for example the maintenance crew may access the information provided by the processing unit. The users may then be informed about the health of the power transformer and the entire power grids.

The processing unit is configured to process the signals retrieved by the sensors, and provide at least one analysed information. The analysed information is related to the state of the power transformer, and may comprise information regarding the input DC offset, phase imbalance, THD, thermal and magnetic model or models. This information may be stored on a computer-readable storage medium.

The data processing system or part of the data processing system is easily implemented onto existing operational power transformers, for example by arranging the sensors on the outer side of the cabinet. The data processing system is also easy to implement in new power transformer installations. The sensors may be arranged on the outer side and/or the inner side of the cabinet, or as a built-in system inside the cabinet.

The present disclosure also presents a data processing system wherein the processing unit is capable of processing said vibroacoustic signal retrieved from a three-phase power transformer.

The present disclosure also provides a computer program product. The computer program product comprises instructions for analysing the state of a power transformer in power grids, carrying out the acts of the computer implemented method of analysing the state of power transformers in power grids.

The computer program product may provide real time measurement. The computer program product provides one or more sequences of vibroacoustic signals, where each sequence of vibroacoustic signal or signals is to be analysed. The analysed information is stored on a computer-readable storage medium. The one or the plurality of sequences of vibroacoustic signals may be accessible for the user using a user interface on a remote computer.

A computer-readable storage medium comprises instructions for generating at least one data information, when executed in a data processing system, where the computer program product analyses the state of a power transformer in power grids to carry out the acts comprised in the method of analysing the state of a one-phase and/or three-phase power transformers in power grids.

A computer-readable storage medium having stored data information provided by a data processing system, when carrying out the acts of detecting unwanted loads.

The disclosure has now been explained with reference to a few examples which have only been discussed in order to illustrate the many possibilities and varying design possibilities achievable with the computer implemented system for analysing the state of power transformers in power grids according to the present disclosure.

The disclosure provides a method and a detection system for analysing the state of power transformers in grids. The method and detection system provides a solution for preventing overload in power transformers by given a plurality of information regarding the health of the power transformer. The method and detection system furthermore ensure a correct and reliable measurement of the power transformers, when determining the working state of the power transformers.

The disclosure provides the method and the detection system for analysing the signals which in power transformers are significant to electric power grids. There are many causes of failure, which can be detected before becoming a problem using this disclosure, Failure such as insulation failures, design and/or manufacturing errors, oil contamination, overloading, line surge, loose connections, moisture, and other man-made or natural causes etc.

The disclosure also provides a method that reduces maintenance costs and expand the life-span of the power transformer, by monitoring the power transformers in real time, and predicting failures before the failures become destructive for the system. The detection system is easily implemented in existing and new power transformers.

BRIEF DESCRIPTION OF THE DRAWINGS

The examples of the disclosure are described in the following with reference to.

DETAILED DESCRIPTION

Figure 1:
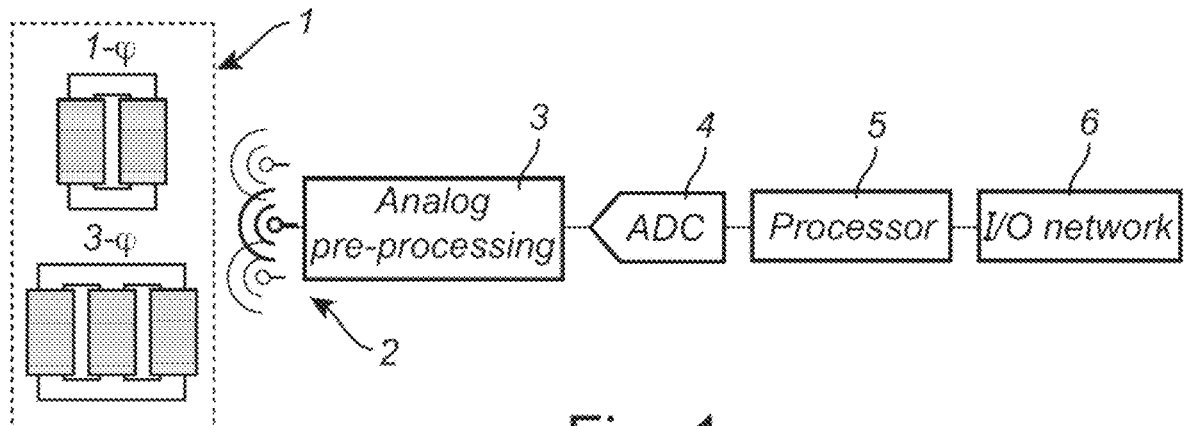
FIG. 1: A simplified block diagram illustrating a first step of retrieving vibroacoustic or other sensor signal.

An example of the disclosure is explained in the following detailed description. It is to be understood that the disclosure is not limited in its scope to the following description or illustrated in the drawings. The disclosure is capable of other examples and of being practiced or carried out in various ways.

FIG. 1: A simplified block diagram illustrating a first step of retrieving vibroacoustic signal 2, or other signals such as electromagnetic field or temperature, from or relative to a power transformer 1. The vibroacoustic signal 2 may be vibrations, sound waves and/or electromagnetic signals. The vibroacoustic signal or signals 2 are retrieved, for example as an analogue signal in a retrieving unit, which is capable of retrieving an analogue signal e.g. an analogue pre-processing unit 3. The analogue signal from the analogue pre-processing unit 3 is then sampled into a digital signal in the ADC unit 4. The digital signal from the ADC unit 4 is then processed in the processing unit 5. A noise reduction algorithm may be provided in the processing unit 5. The processed signal may be transmitted to an external computer by wire or wireless. The processed signals may be transmitted sequentially as a real time measurement.

Figure 2:
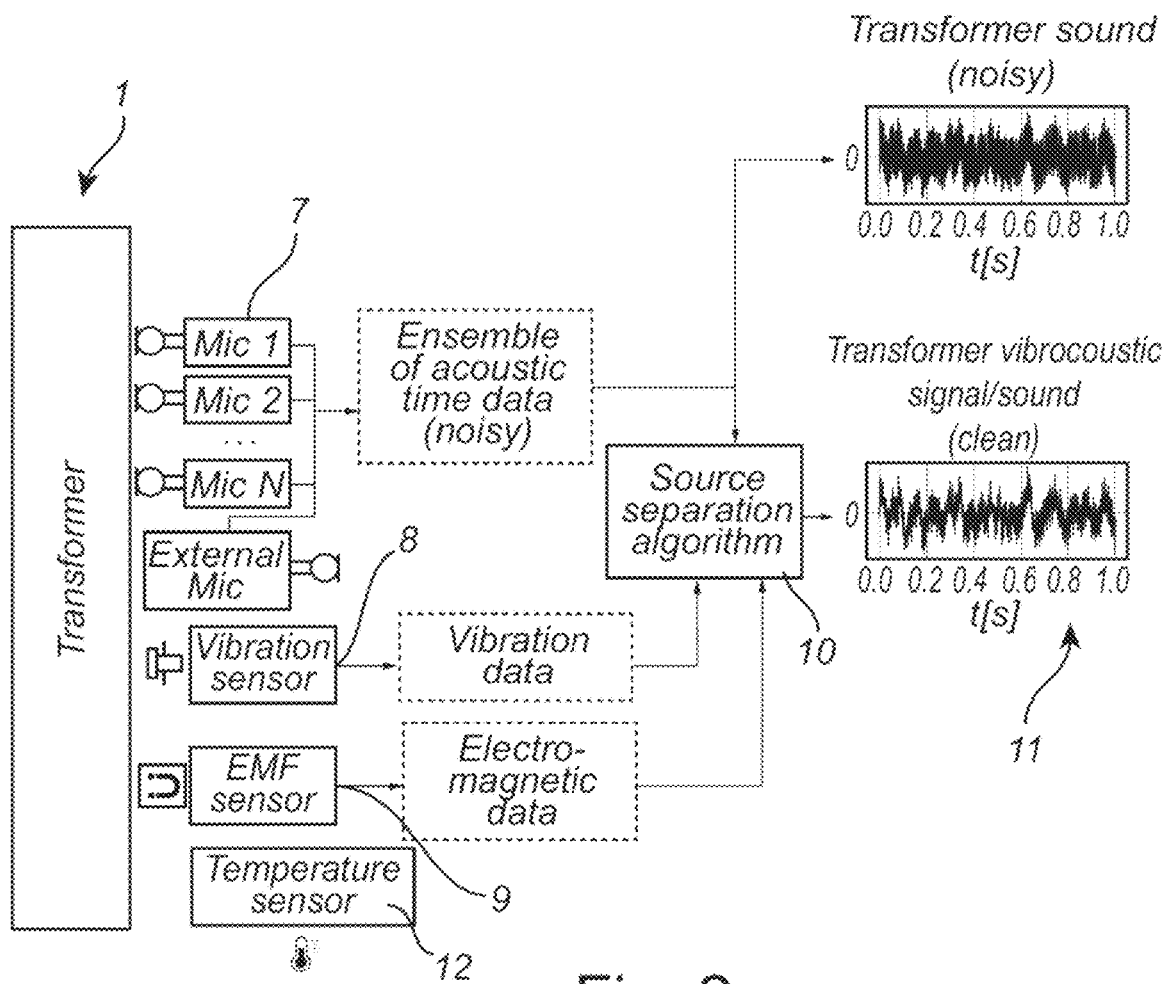
FIG. 2: Illustration of measurement when attaching sensors relative to the power transformer.

FIG. 2: Illustration of measurement when attaching sensors relative to the power transformer 1. The vibrations from the power transformer 1, for example the vibrations which are provided in the cabinet, may be retrieved using one or more vibration sensors 8, which provide vibration data to the source separation algorithm 10. The sound waves may be retrieved using one or more microphones 7. The sound waves are generated or partly generated by the entire transformer cabinet and transformer parts. One or more of the microphones may retrieve sound waves from the surroundings. The microphones 7 are providing sound wave data to the source separation algorithm 10. The electromagnetic signals emitted from the power transformer 1, may be retrieved using one or more EMF sensors 9, which provide electro-magnetic data to the source separation algorithm 10. The EMF sensor is capable of measuring a voltage level, which has a substantially linear function relative to the voltage level in the power transformer. The EMF sensor is capable of providing data regarding the voltage level in real time. Other sensors may be provided, such as temperature sensors 12.

The sensor or sensors are easily attached to said outer surface of the power transformer 1 cabinet. The noise reduction, which may be integrated in the source separation algorithm 10, is capable of separating or partly separating the vibroacoustic signal from the unwanted noise from the surrounding, and thereby providing a reliable vibroacoustic signal 11.

The retrieved signal from the sensors 7, 8, 9 may be sent to an external computer before or after providing the noise reduction. The retrieved signal may be sent using wire or wireless connection. The wireless connection may be wifi, lora, sigfox, NBIoT and/or 2345G, etc.

Figure 3:
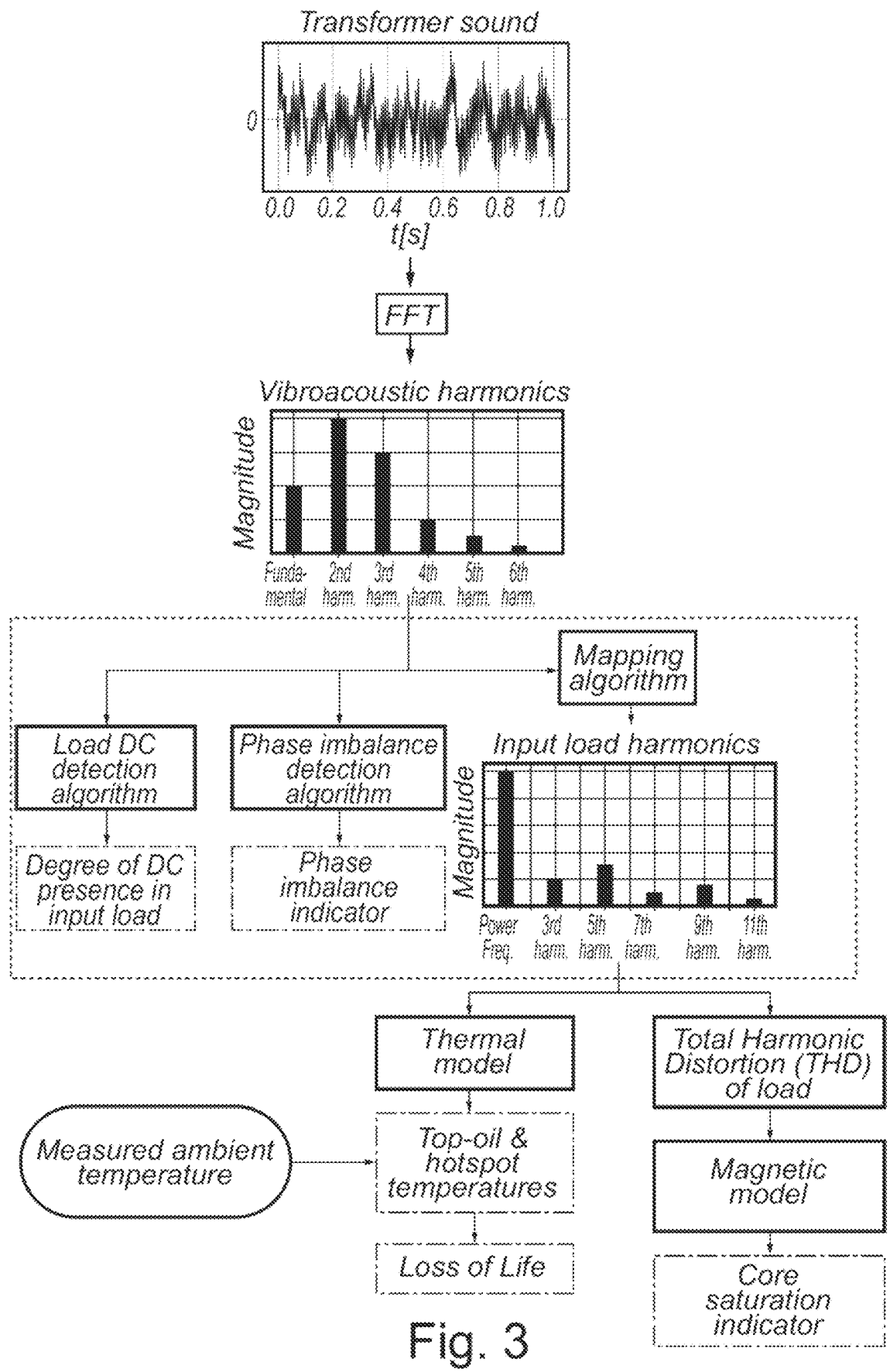
FIG. 3: A simplified block diagram illustrating a signal analysing process.

FIG. 3: A simplified block diagram illustrating a signal analysing process. The vital part of the method for analysing the state of power transformers in power grids is highlighted using dotted line.

The harmonic is the distortion in the waveform of the voltage and current. It is the integral multiple of some reference waves. The harmonic wave increases the core and copper loss of the transformer and hence reduces their efficiency. It also increases the dielectric stress on the insulation of the transformer. In a three-phase transformer, the non-sinusoidal nature of magnetising current produces sinusoidal flux which gives rise to the undesirable phenomenon. The phase magnetising currents in transformer may comprise third harmonics and higher harmonics necessary to produce a sinusoidal flux.

The vibroacoustic signal is retrieved using sensor or sensors. The at least one vibratory and/or at least acoustic signal is measured in a predefined time, where after the vibratory and/or the acoustic signal can be analysed separately or combined. The vibroacoustic signal is in a time domain, and for example measured in a sample of seconds. The sample of the vibroacoustic signal is then transferred from the time domain to a frequency domain, for example using fast Fourier transformation to a range of vibroacoustic harmonic frequencies.

An analyzing of the amplitude and phase angle for each of the vibroacoustic harmonic frequencies provides following analysed information: input DC offset and/or phase imbalance. An input DC offset is calculated using a load DC detection algorithm, for example by using following steps to sample vibroacoustic data, and then perform frequency decomposition, e.g. FFT analysis. Estimate magnitude at power frequency. Estimate magnitudes at odd multiples of power frequency. Estimate magnitude of vibroacoustic fundamental. Quantify presence and degree of DC offset using for example, Ratio between magnitude at power frequency and vibroacoustic fundamental. Use pre-trained ANN for classifying presence of DC offset with magnitudes at power frequency, odd multiples of power frequency and vibroacoustic fundamental A phase imbalance is calculated using a phase imbalance detection algorithm, for example using following steps: Sample vibroacoustic data. Perform frequency decomposition. Estimate magnitude of vibroacoustic fundamental. Estimate higher harmonics of vibroacoustic fundamental. Quantify presence and degree of phase imbalance using for example ratio between magnitude at higher harmonics and vibroacoustic fundamental. Use pre-trained ANN for classifying presence of phase imbalance with magnitudes at vibroacoustic fundamental and higher harmonics of vibroacoustic fundamental Furthermore the vibroacoustic harmonic frequencies may be mapped into input load harmonic frequencies. The input load harmonic frequencies may be described as that of a fundamental frequency and odd higher harmonics, such as $3^{rd}$, $5^{th}$, etc.

The input load harmonic frequencies may provide basic information for providing a more exact and solid thermal model.

Furthermore, the input load harmonic frequencies may provide basic information for a more accurate calculation of THD of the Load, which may lead to a more exact and solid magnetic model.

Figure 4:
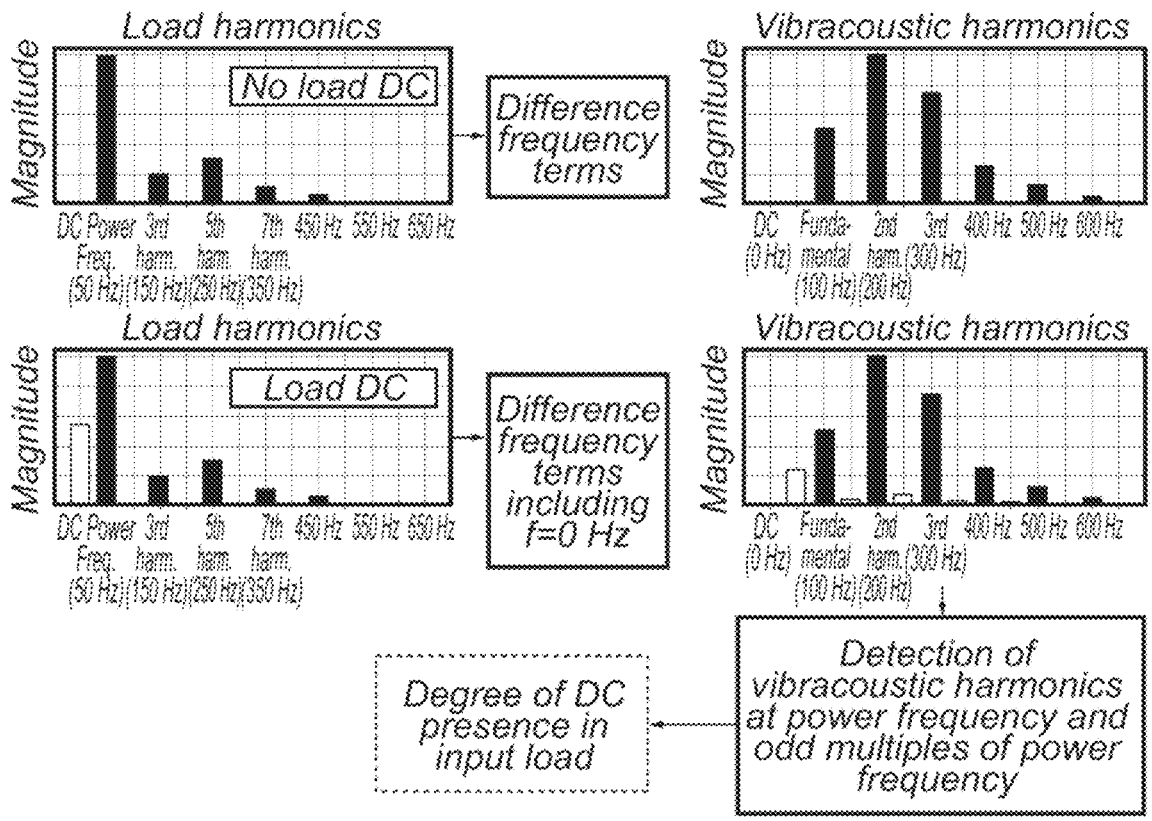
FIG. 4: Illustration non-load DC offset vs load DC offset.

FIG. 4: Illustration of load harmonic frequencies. If a non-linear load is present, the spectrum will clearly reveal the degree of the input DC offset.

If there is a linear load, the vibroacoustic harmonic frequencies will comprise the fundamental frequency of the load, and the harmonic frequencies of the fundamental frequency. In this example the fundamental frequency of the load is 100 Hz, and the harmonic frequencies of the fundamental frequency are 200 Hz, 300 Hz etc.

If there is a nonlinear load, the vibroacoustic harmonic frequencies will comprise the fundamental frequency of the load, and the harmonic frequencies of the fundamental frequency, and the fundamental frequency of the load divided by two, and the harmonic frequencies of the fundamental frequency of the load divided by two. In this example the fundamental frequency of the load is 50 Hz, and the harmonic frequencies of the fundamental frequency are 100 Hz, 150 Hz etc.

Figure 5:
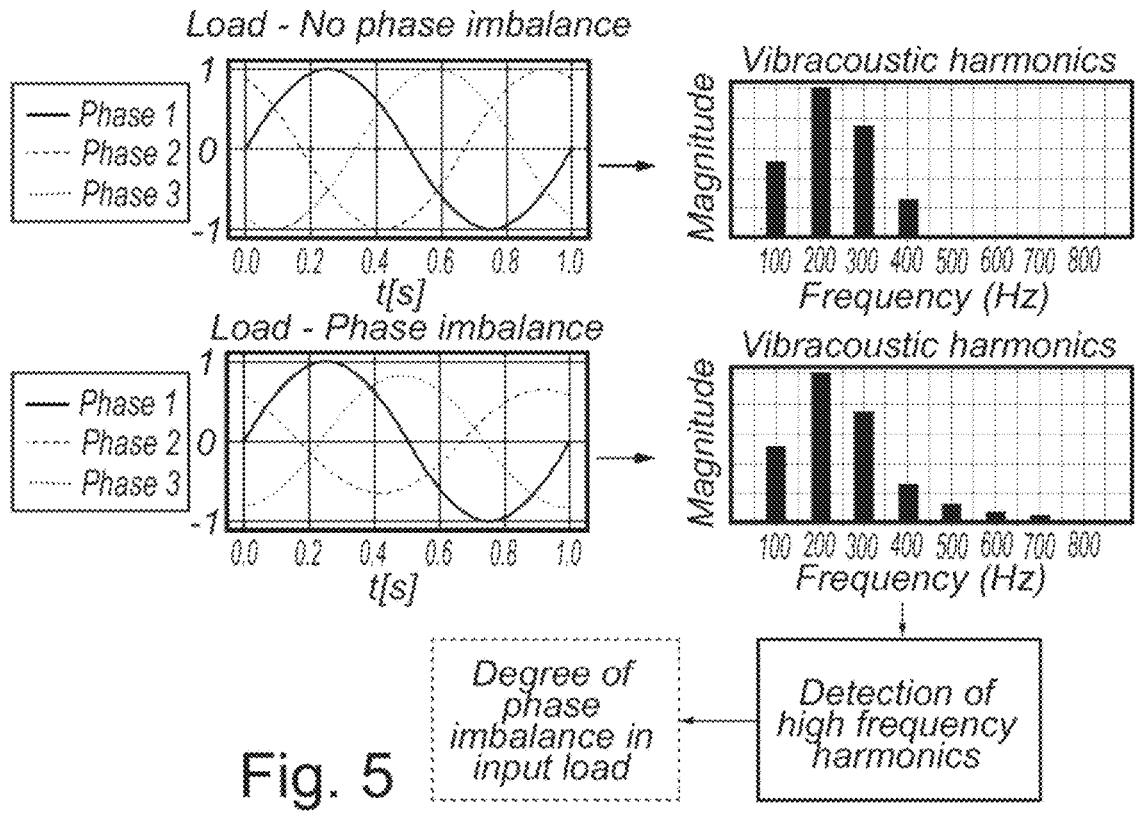
FIG. 5: Illustration of phases relative to the spectral distribution.

FIG. 5: Illustration of phases balance vs. phases imbalance. If imbalanced loads are present, the spectrum will clearly reveal the degree of phase imbalance in the power transformer. In a balanced system each line will produce equal voltage magnitudes at phase angles equally spaced from each other. If voltage magnitudes are not equal, a phase imbalance will occur.

If the phases of the load in a three phase power transformer are in balance the phases have an equal voltage magnitude, which comprises the fundamental frequency of the load, and the harmonic frequencies of the fundamental frequency. In this example the fundamental frequency of the load is 100 Hz, and the harmonic frequencies of the fundamental frequency are 200 Hz, 300 Hz, and 400 Hz.

If the phases of the load in a three phase power transformer are in imbalance, the phases have not equal voltage magnitudes. The vibroacoustic will then comprise the fundamental frequency of the load, and more harmonic frequencies of the fundamental frequency than a balanced three phase power transformer. In this example the fundamental frequency of the load is 100 Hz, and the harmonic frequencies of the fundamental frequency are 200 Hz, 300 Hz, 400-800 Hz. The amount of energy in the harmonic frequencies is higher than in a balanced system.

Figure 6:
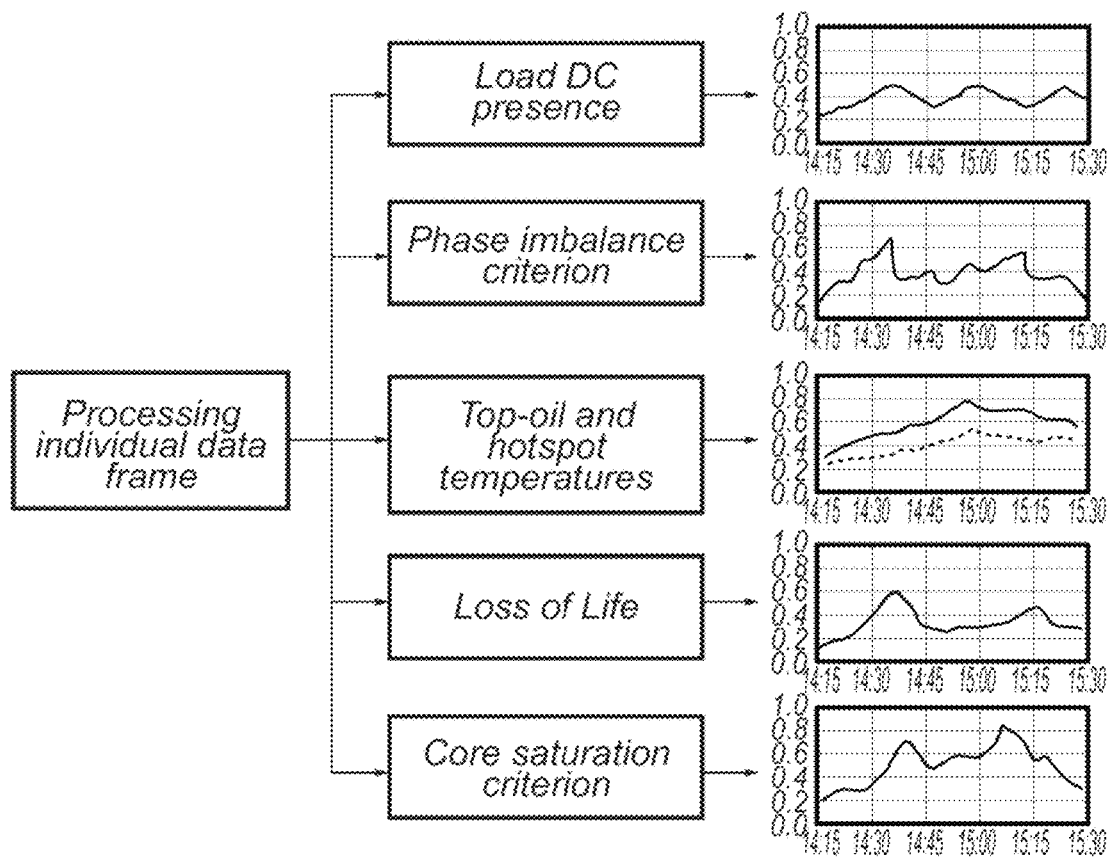
FIG. 6: Illustration real time measurement of a transformer's condition.

FIG. 6 illustrates real time measurement of a transformer's condition. The data processing system comprises means for carrying out one or more acts for analysing the state of a power transformer in power grids. The data processing system processes the vibroacoustic signal retrieved in predefined data frames from a transformer.

The data processing system is configured to process the predefined data frames comprising the signal or signals retrieved by the sensors, and provide data frame information. The analysed data frame information may be related or indirectly related to the state of the transformer, such as DC offset, DC load, phase imbalance, top-oil and hot-spot temperatures, loss of life and core saturation. The analysed data frame information can be showed on a user interface, for example a graphical user interface, GUI. The analysed data frame information is stored on a computer-readable storage medium.

Figure 7:
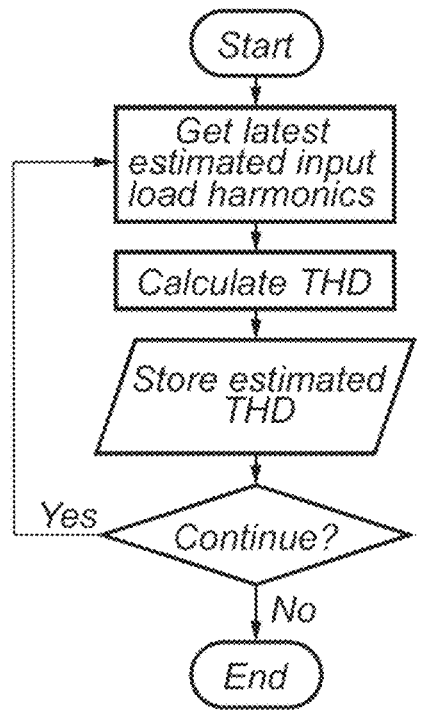
FIG. 7: Showing a flowchart of calculation of total harmonic distortion, THD.

FIG. 7 shows a flowchart of calculation of total harmonic distortion, THD. The analysed data frame information may comprise vibroacoustic harmonic frequencies which are mapped into load harmonic frequencies from where the THD information is received. The THD information is calculated for each data frame information retrieved by the data processing system. The THD information can also be showed on a user interface, for example a graphical user interface, GUI. The analysed data frame information of the THD is stored on a computer-readable storage medium.

Figure 8:
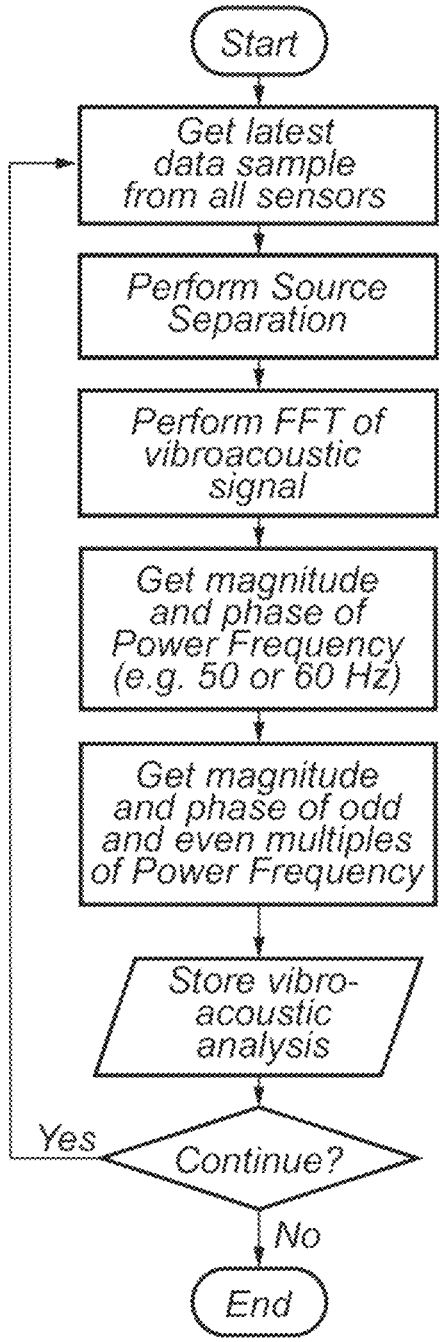
FIG. 8: Showing a flowchart of pre-processing a vibroacoustic signal.

FIG. 8 shows a flowchart of pre-processing a vibroacoustic signal retrieved from the transformer. Data samples are retrieved and arranged in data frames.

At least one sensor may be arranged in a predefined position relative to the transformer, such that the sensor or sensors retrieves the acoustic-vibrations generated by the transformer. The vibroacoustic signal received from the sensors is in time domain. The sensors may be microphones arranged in opposite directions to perform source separation, for example for noise reduction purposes. A time-frequency decomposition of said at least one vibroacoustic signal from a time domain to a frequency domain may be performed using fast Fourier transformation, FFT. In the frequency domain, the vibroacoustic harmonic frequencies can easily be identified for further processing. The information regarding vibroacoustic harmonic frequencies may be stored on a computer-readable storage medium.

The amplitude value and the phase angle, such as amplitude value and the phase angle of the current, related to the harmonic frequencies is calculated based on the information in each data frame. The analysed amplitude value and phase angle may be stored on a computer-readable storage medium.

Figure 9:
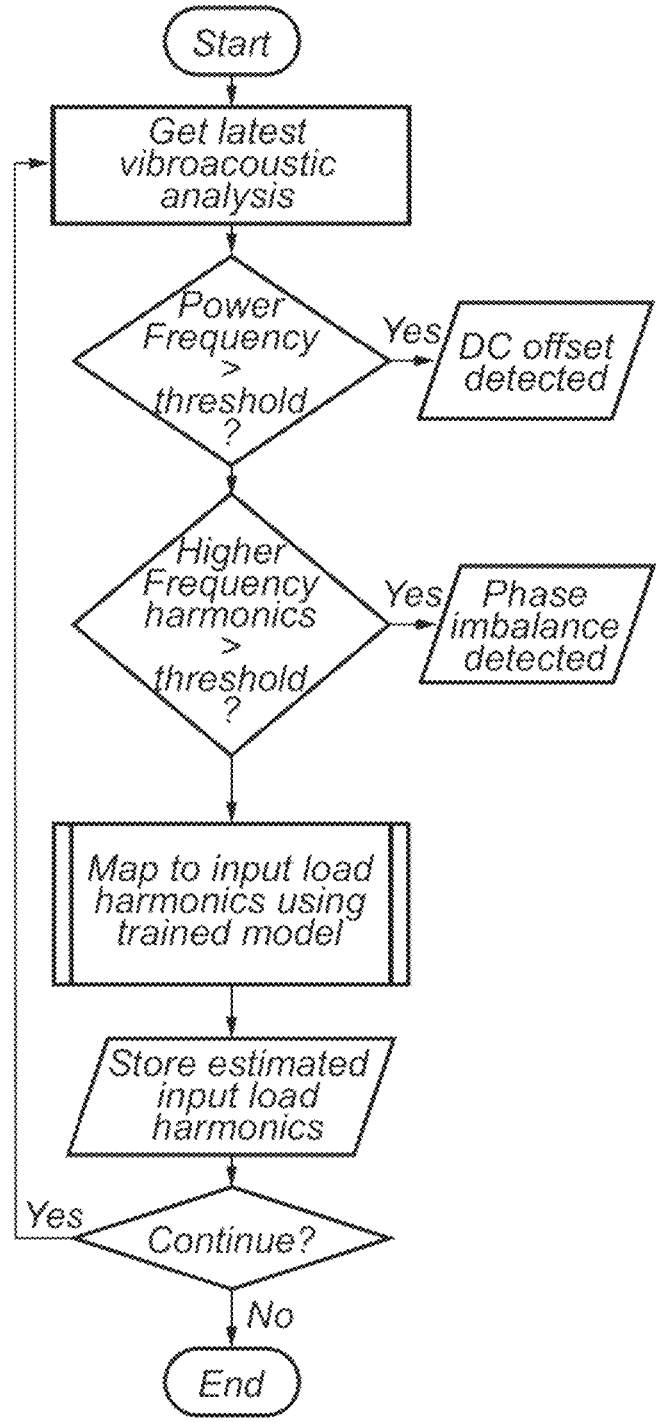
FIG. 9: Showing a flowchart of detecting a DC-offset and/or phase imbalance.

FIG. 9 shows a flowchart of detecting a DC-offset and/or phase imbalance. The vibroacoustic harmonic frequencies, the amplitude value and the phase angle are retrieved from the computer-readable storage medium if the information is stored. The DC-offset and/or phase imbalance is then calculated from the result of the calculation analysed harmonic frequencies. A trained model algorithm maps the analysed harmonic frequencies into load harmonic frequencies. The load harmonic frequencies may be stored on a computer-readable storage medium.

Figure 10:
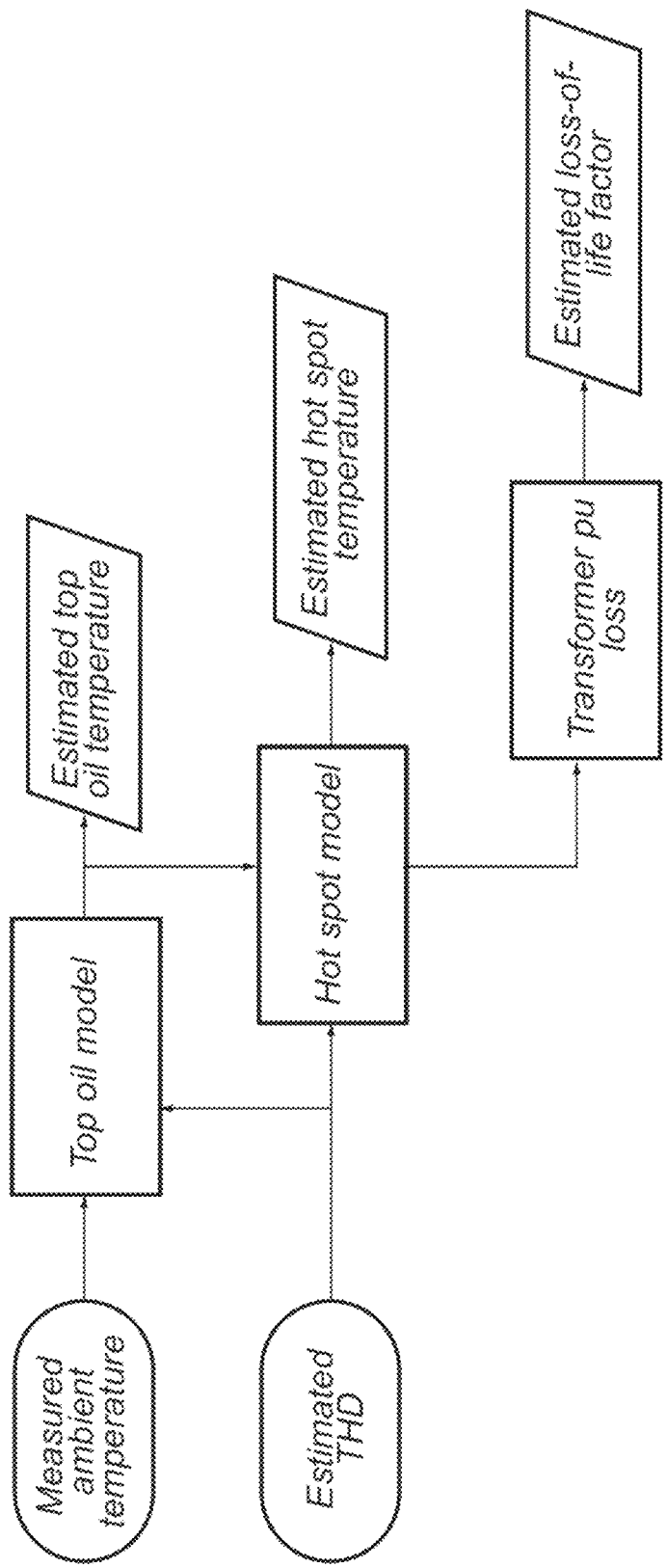
FIG. 10: Showing a flowchart of measuring top-oil, hot-spot, and loss-of-life factor.

FIG. 10 shows a flowchart of measuring top-oil, hot-spot, and loss-of-life factor. The top-oil, hot-spot, and loss-of-life factor may be calculated from an ambient temperature in relation to the THD using one or more algorithm models.

The top-oil model is a computation or a formula formed as a result of an algorithm that takes some values such as ambient temperature and THD as input, and produces some value as top-oil model output. The top-oil model output relates to the top-oil temperature. The top-oil model may be one or more trained model or models based on the input from data frame information of vibroacoustic signal retrieved by the sensors.

The hot-spot model is a computation or a formula formed as a result of an algorithm that takes some values such as top-oil model output and THD as input, and produces some value as one or more hot-spot model output. The hot-spot model output relates to the hot-spot temperature and/or a value which is related to the loss of life factor. The hot-spot model may be one or more trained model or models based on the input from data frame information of vibroacoustic signal retrieved by the sensors.

Figure 11:
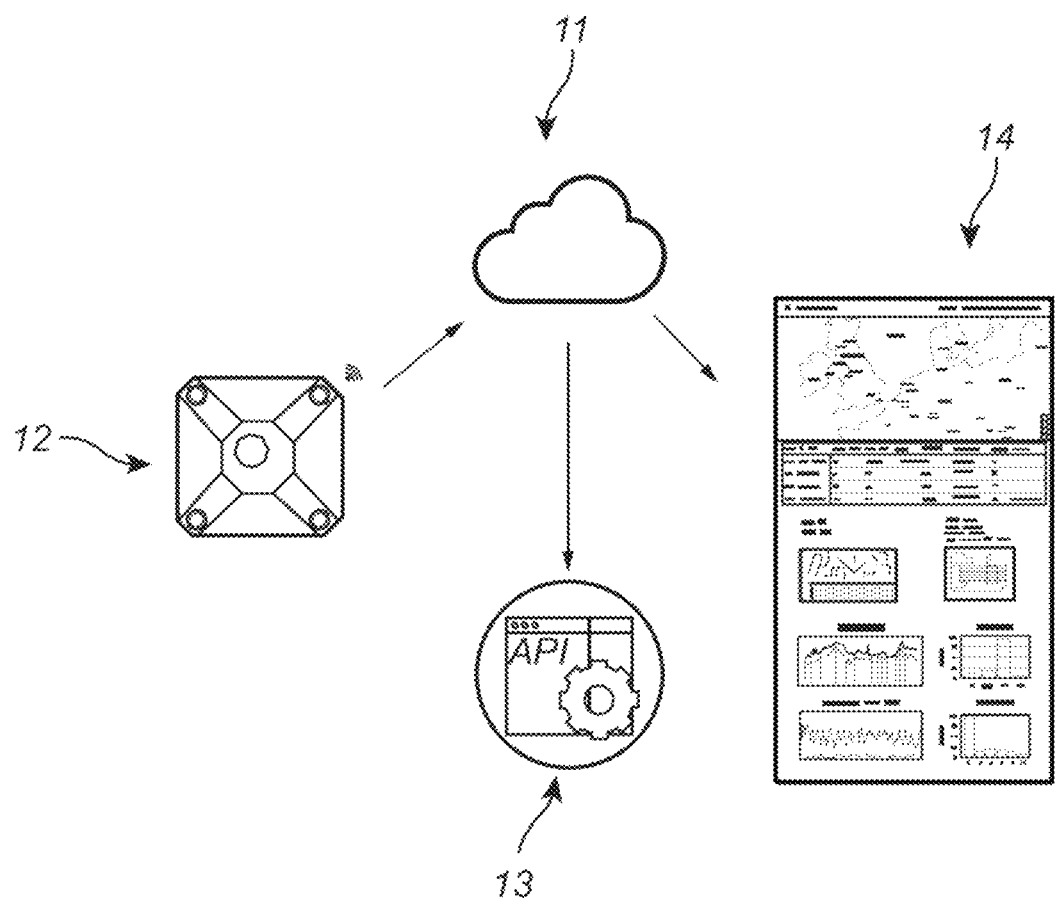
FIG. 11: Illustrating a computer program product providing real time measurement to an user interface.

FIG. 11 illustrates a computer program product providing real time measurement to a first user interface 13, e.g. an API, and/or to a second user interface 14, e.g. a mobile unit or a service panel. The computer program product comprises instructions for analysing the state of a power transformer in power grids.

The retrieved signal from the sensors in a sensor unit 12 comprising one or more sensors may be sent to the cloud 11 before or after providing the noise reduction. The retrieved signal may be sent from the sensor unit 12 to a cloud 11 using wire or wireless connection. The cloud may comprise a computer-readable storage medium which is capable of storing data information. The data information comprising the diagnosing result of the state of the transformer may then be sent to the first user interface 13 and/or to a second user interface.

The invention claimed is:

1. A method for analysing a state of power transformers in power grids, comprising:
    providing at least one sensor arranged relative to a power transformer;
    retrieving at least one vibroacoustic signal from said at least one sensor;
    performing a time-frequency decomposition of said at least one vibroacoustic signal from a time domain to a frequency domain using fast Fourier transformation;
    identifying one or more vibroacoustic harmonic frequencies provided by the fast Fourier transformation of said at least one vibroacoustic signal;
    calculating an amplitude value and a phase angle related to said one or more vibroacoustic harmonic frequencies;
    calculating one or more load harmonic frequencies from said one or more vibroacoustic harmonic frequencies;
    analysing said amplitude value and said phase angle related to said one or more load harmonic frequencies and calculating a total harmonic distortion (THD) of load information;
    providing, based on the THD of the load information at least one of:
        a thermal model capable of providing temperature information related to a state of a top-oil temperature in the power transformer, a state of a hotspot temperature in the power transformer, or both, or
        a magnetic model capable of providing core saturation information related to a state of a core saturation in the power transformer;
    retrieving an electromagnetic signal emitted from said power transformer using at least one electromagnetic field (EMF) sensor;
    retrieving a temperature generated by the power transformer using at least one temperature sensor; and
    providing at least one analysed information from said amplitude value and said phase angle related to said one or more vibroacoustic harmonic frequencies, said thermal model or said magnetic model, said electromagnetic signal, and said temperature, where the at least one analysed information is related to a state of the power transformer.

2. The method of claim 1, further comprising:
    performing at least one noise reduction of said at least one vibroacoustic signal before performing said fast Fourier transformation.

3. The method of claim 1, further comprising:
    calculating a phase imbalance information related to said one or more vibroacoustic harmonic frequencies, wherein the phase imbalance information comprises information regarding the state of phases in the power transformer.

4. The method of claim 1, wherein the power transformer is a three-phase power transformer.

5. The method of claim 1, further comprising:
    calculating an input direct-current (DC) offset information related to said one or more vibroacoustic harmonic frequencies, wherein an input DC offset comprises information regarding the state of the input DC offset in the power transformer.

6. The method of claim 1, further comprising:
    periodically calibrating said at least one sensor and values to provide an accuracy enhancement by characterization of errors inherent in a data processing system used for analysing the state of the power transformers.

7. A data processing system for analysing a state of a power transformer, comprising:
    at least one sensor arranged relative to said power transformer, wherein said at least one sensor is capable of retrieving acoustic-vibrations generated by the power transformer;
    a processing unit configured to:
        retrieve at least one vibroacoustic signal from said at least one sensor,
        perform a time-frequency decomposition of said at least one vibroacoustic signal from a time domain to a frequency domain using fast Fourier transformation,
        identify one or more vibroacoustic harmonic frequencies provided by the fast Fourier transformation of said at least one vibroacoustic signal,
        calculate an amplitude value and a phase angle related to said one or more vibroacoustic harmonic frequencies,
        calculate one or more load harmonic frequencies from said one or more vibroacoustic harmonic frequencies,
        analyse said amplitude value and said phase angle related to said one or more load harmonic frequencies and calculating a total harmonic distortion (THD) of load information,
        provide, based on the THD of the load information at least one of:
            a thermal model capable of providing temperature information related to a state of a top-oil temperature in the power transformer, a state of a hotspot temperature in the power transformer, or both, or
            a magnetic model capable of providing core saturation information related to a state of a core saturation in the power transformer,
        retrieve an electromagnetic signal emitted from said power transformer using at least one electromagnetic field (EMF) sensor,
        retrieve a temperature generated by the power transformer using at least one temperature sensor, and
        provide at least one analysed information from said amplitude value and said phase angle related to said one or more vibroacoustic harmonic frequencies, said thermal model or said magnetic model, said electromagnetic signal, and said temperature, where the at least one analysed information is related to a state of the power transformer; and
    a non-transitory computer-readable storage medium for storing the at least one analysed information.

8. The data processing system of claim 7, wherein the power transformer is a three-phase power transformer, and wherein the processing unit is capable of processing said at least one vibroacoustic signal.

9. The data processing system of claim 7, wherein the processing unit is further configured to:
self-calibrate sensors and values used in the data processing system.

10. A non-transitory computer-readable storage medium comprising instructions for analysing a state of power transformers in power grids that are executable by a processor of a device to cause the device to:
retrieve at least one vibroacoustic signal from at least one sensor arranged relative to a power transformer;
perform a time-frequency decomposition of said at least one vibroacoustic signal from a time domain to a frequency domain using fast Fourier transformation;
identify one or more vibroacoustic harmonic frequencies provided by the fast Fourier transformation of said at least one vibroacoustic signal;
calculate an amplitude value and a phase angle related to said one or more vibroacoustic harmonic frequencies;
calculate one or more load harmonic frequencies from said one or more vibroacoustic harmonic frequencies;
analyse said amplitude value and said phase angle related to said one or more load harmonic frequencies and calculating a total harmonic distortion (THD) of load information;
provide, based on the THD of the load information at least one of:
a thermal model capable of providing temperature information related to a state of a top-oil temperature in the power transformer, a state of a hotspot temperature in the power transformer, or both, or
a magnetic model capable of providing core saturation information related to a state of a core saturation in the power transformer;
retrieve an electromagnetic signal emitted from said power transformer using at least one electromagnetic field (EMF) sensor, and retrieve a temperature generated by the power transformer using at least one temperature sensor measurement; and
provide at least one analysed information from said amplitude value and said phase angle related to said one or more vibroacoustic harmonic frequencies, said thermal model or said magnetic model, said electromagnetic signal, and said temperature, where the at least one analysed information is related to a state of the power transformer.

11. The non-transitory computer-readable storage medium of claim 10, wherein the instructions are further executable by the processor to cause the device to:
perform at least one noise reduction of said at least one vibroacoustic signal before performing said fast Fourier transformation.

12. The non-transitory computer-readable storage medium of claim 10, wherein the instructions are further executable by the processor to cause the device to:
calculate a phase imbalance information related to said one or more vibroacoustic harmonic frequencies, wherein the phase imbalance information comprises information regarding the state of phases in the power transformer.

13. The non-transitory computer-readable storage medium of claim 10, wherein the instructions are further executable by the processor to cause the device to:
calculate an input DC offset information related to said one or more vibroacoustic harmonic frequencies, wherein an input DC offset comprises information regarding the state of the input DC offset in the power transformer.

14. The non-transitory computer-readable storage medium of claim 10, wherein the instructions are further executable by the processor to cause the device to:
periodically calibrate said at least one sensor and values to provide an accuracy enhancement by characterization of errors inherent in a data processing system used for analysing the state of the power transformer.

* * * * *